US012348005B2

(12) United States Patent
Sacher

(10) Patent No.: US 12,348,005 B2
(45) Date of Patent: Jul. 1, 2025

(54) LASER DIODE ASSEMBLY HAVING AN EXTERNAL RESONATOR

(71) Applicant: Sacher Lasertechnik GmbH, Marburg (DE)

(72) Inventor: Joachim Sacher, Marburg (DE)

(73) Assignee: Sacher Lasertechnik GmbH, Marburg (DE)

( * ) Notice: Subject to any disclaimer, the term of this patent is extended or adjusted under 35 U.S.C. 154(b) by 879 days.

(21) Appl. No.: 17/058,746

(22) PCT Filed: May 23, 2019

(86) PCT No.: PCT/EP2019/063392
§ 371 (c)(1),
(2) Date: Nov. 25, 2020

(87) PCT Pub. No.: WO2019/224331
PCT Pub. Date: Nov. 28, 2019

(65) Prior Publication Data
US 2021/0226419 A1    Jul. 22, 2021

(30) Foreign Application Priority Data

May 25, 2018   (DE) ...................... 10 2018 112 561.5

(51) Int. Cl.
*H01S 5/14* (2006.01)
*H01S 5/00* (2006.01)
(52) U.S. Cl.
CPC ............ *H01S 5/141* (2013.01); *H01S 5/0064* (2013.01); *H01S 5/005* (2013.01)
(58) Field of Classification Search
CPC ......... H01S 5/141; H01S 5/0064; H01S 5/005
See application file for complete search history.

(56) References Cited

U.S. PATENT DOCUMENTS

| 5,956,355 A | * | 9/1999 | Swanson | ............... H01S 3/0812 372/20 |
| 6,421,164 B2 | * | 7/2002 | Tearney | ............... A61B 5/0064 250/227.27 |

(Continued)

FOREIGN PATENT DOCUMENTS

DE       102014201701       7/2015

OTHER PUBLICATIONS

MEMS Technology, Mar. 20, 2013, Mouser Electronics (Year: 2013).*

(Continued)

*Primary Examiner* — Tod T Van Roy
(74) *Attorney, Agent, or Firm* — Loginov & Associates, PLLC; William A. Loginov

(57) ABSTRACT

The invention relates to a laser diode assembly for producing single-mode, tunable laser radiation. The laser diode assembly comprises a laser diode (4) and an external resonator (10), which is coupled thereto and comprises a resonator mirror (12) and a wavelength-selective optical reflective element (14) having a diffractive surface. The resonator mirror is mounted for rotation about a pivot axis (16) and can be selectively rotated about the pivot axis by means of a deflecting device. The external resonator is designed such that a laser beam emitted from the laser diode into the external resonator impinges on a mirror surface (30) of the resonator mirror (12) at a first angle of incidence, which is dependent on the rotation of the resonator mirror, and is reflected by the resonator mirror onto the at least one wavelength-selective optical reflective element at a second angle of incidence, which is dependent on the first angle of incidence, an optical distance (d) between the resonator mirror and the diffractive surface (20) being influenced by the first angle of incidence (γ), and that the wavelength-selective optical reflective element reflects the laser beam, so (Continued)

Figure 1:
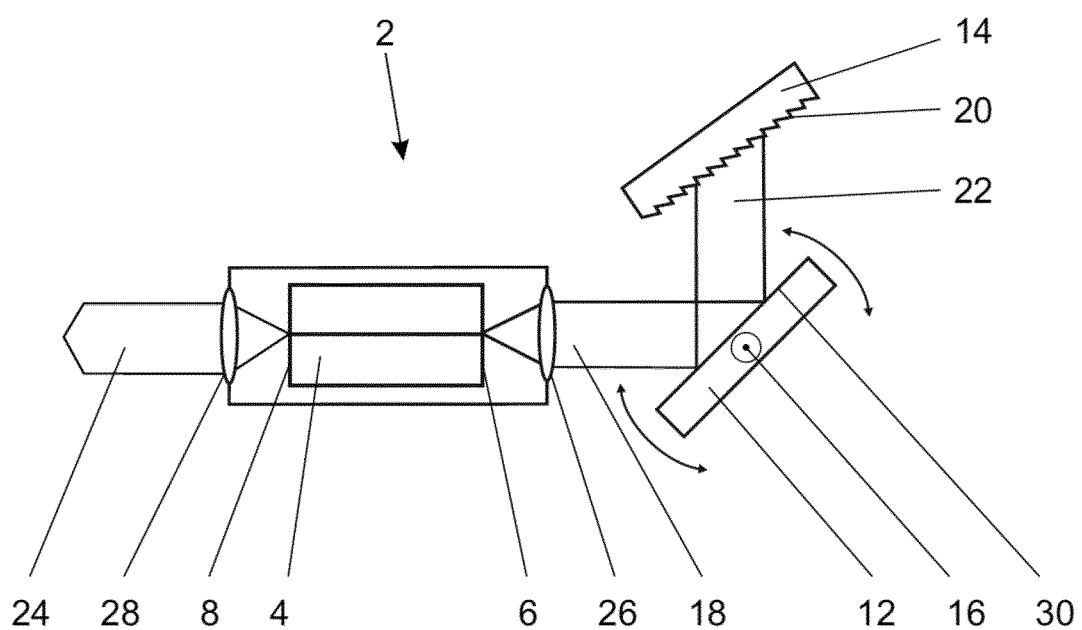

as to be diffracted, back to the resonator mirror. The wavelength of the laser beam reflected by the wavelength-selective reflective element is influenced by the second angle of incidence ($\varphi$).

14 Claims, 9 Drawing Sheets

(56) References Cited

U.S. PATENT DOCUMENTS

| | | | | |
|---|---|---|---|---|
| 6,463,085 | B1* | 10/2002 | Tayebati | G02B 26/0841 |
| | | | | 372/45.01 |
| 7,260,122 | B2* | 8/2007 | Sanders | H01S 5/141 |
| | | | | 372/19 |
| 2003/0007523 | A1* | 1/2003 | Chapman | H01S 5/141 |
| | | | | 372/20 |
| 2005/0105567 | A1* | 5/2005 | Sacher | H01S 5/141 |
| | | | | 372/20 |
| 2006/0109872 | A1* | 5/2006 | Sanders | H01S 5/141 |
| | | | | 372/19 |
| 2010/0067554 | A1* | 3/2010 | Wysocki | B82Y 20/00 |
| | | | | 359/200.8 |
| 2015/0349492 | A1* | 12/2015 | Muro | H01S 5/143 |
| | | | | 372/20 |
| 2018/0139849 | A1* | 5/2018 | Oshima | G03F 7/2051 |
| 2021/0226419 | A1* | 7/2021 | Sacher | H01S 5/0064 |

OTHER PUBLICATIONS

RP photonics—dispersion (Year: 2012).*
Jiménez A et al, "Narrow-line external cavity diode laser micro-packaging in the NIR and MIR spectral range", Applied Physics B: Lasers and Optics, Springer International, Berlin, DE, vol. 123, No. 7, doi:10.1007/S00340-017-6777-9, ISSN 0946-2171, (Jul. 4, 2017), pp. 1-9, (Jul. 4, 2017), XP036281513.

* cited by examiner

LASER DIODE ASSEMBLY HAVING AN EXTERNAL RESONATOR

The invention resides in a laser diode arrangement with an external resonator according to the preamble of claim 1.

Laser diodes have a small size and a high reliability. However, the wavelength of a laser beam emitted by a laser diode is only quite unreliably adjustable by controlling a laser diode temperature and an injection current. In addition, the line width, that is the bandwidth of the emission wavelength, is relatively large. The coupling of a laser diode with an external resonator is quite common in the optical testing technique and permits a more precise adjustment of the desired optical properties, which is also called tuning.

An external resonator generally includes wavelength selective elements such as screens and filters which couple only light of certain wavelength—the resonators modes—back into the laser diode. This results in an amplification of the stimulated emission of the respective adjusted wavelength. At the same time, via the wavelength selective element, the emission wavelength can be adjusted or "tuned" over the amplification range of the laser diode.

In particular, two arrangements of laser diodes with such an external resonators have become common. They are known as Littrow- and Littman arrangements.

The Littrow arrangement is based on the back-coupling via an optical diffraction screen, in particular a Blaze screen which is so oriented that the first diffraction order is reflected back into the laser diode. The direct reflection (o. diffraction order) forms the uncoupling beam of the laser. By a control of the orientation of the grid relative to the emitted laser beam of the laser diode the wavelength can be changed in a certain range by amplification of another longitudinal resonator mode in the laser diode. Herein, a mode jump can be achieved with the detuning via a suitable selection of the pivot point of the diffraction screen.

In the Littman arrangement, the laser beam emitted from the laser diode reaches an optical diffraction grid under a small angle, whereupon the diffraction of the first order is directed onto a resonator mirror. The mirror reflects the light via the screen back into the laser diode while the diffraction of the O. order is coupled out via the diffraction screen as utilization beam. The detuning of the laser frequency is achieved by a rotation of the mirror. In this way, the detuning can be achieved by a suitable selection of the pivot point of the resonator mirror over a large frequency range continuously and without mode jumps.

Furthermore, diode lasers with external resonators in a Littman arrangement according to Iolon are known. Herein, however relatively expensive tuning arrangements are provided, in which by means of a MEMS-actuator a movement of the above-mentioned resonator mirror occurs in accordance with a correct selection of the pivot point so that a modem jump-free tuning of the wavelength is possible. Besides the high-cost manufacture another disadvantage resides in the low resonance frequency of the MEMS actuator which results in a high sensitivity of the arrangement to interferences.

Also in a laser diode arrangement with an external resonator in a Littrow arrangement according to Schenk a tuning device by means of a MEMS actuator is selected. A movable mirror is structured with lines according to a diffraction screen and replaces the screen of the classical Littrow arrangement. However, a mode jump free tuning of the wavelength is not possible.

DE 10 2014 201 701 A1 discloses an about micromechanically manufactured optical device wherein a plate is rotatably and translatorily movable with regard to a carrier for supporting the device, wherein the plate carries a diffraction screen. The combination of the two types of movement by a deflection device can result in an interference sensitivity of the device. In addition, with the translatory movement, a movement of several millimeters is necessary which cannot be realized in the MEMS scale.

It is the object of the present invention to overcome these and further disadvantages of the state of the art and to provide a laser diode arrangement with an external resonator which is tunable in a mode jump-free manner but which is substantially more simple in its setup than a MEMS actuator of Iolon and has a noticeably higher resonance frequency and, consequently, a reduced sensitivity with respect to interferences from without. An object of the invention is also the generation of a single-mode laser light, whose wavelength is tunable continuously and in a mode jump-free manner. The setup should be achievable with simple and inexpensive means and it should be easy to operate.

The main features of the invention are presented in the characterizing part of claim 1. Various embodiments are the subjects or claims 2 to 14.

Proposed is a laser-diode arrangement for generating single-mode tunable laser radiation, comprising a laser diode and, coupled thereto, an external resonator with a resonator mirror and at least one wavelength selective optical reflection element with a diffracting surface wherein the resonator mirror is supported so as to be rotatable about a pivot axis and is selectively pivotable about the pivot axis by means of a deflection device. The laser diode arrangement is characterized in that the external resonator is so designed that a laser beam emitted by the laser diode into the external resonator with a first incident angle depending on the pivot position of the resonator mirror and hitting a mirror surface of the resonator mirror and is reflected therefrom onto the at least one wavelength selective optical reflection element with a second incident angle which depends on the first incident angle. Hereby, an optical travel distance between the resonator mirror and the diffracting surface is influenced by the first incident angle. The wavelength selective optical reflection element reflects the laser beam back to the resonator mirror, so that it is directed from the resonator mirror back into the laser diode whereby the wavelength of the laser beam reflected from the wavelength selective reflection element is influenced by the second incident angle.

With this design, the manufacturing expenses can be noticeably reduced and, at the same time, the susceptibility to trouble is lowered while a mode jump free tuning over a large frequency range is still possible. This is facilitated in particular by the arrangement of a resonator mirror at an end of the laser diode facing the resonator which mirror reflects a laser beam emitted by the laser diode to the wavelength selective reflection element. The movable parts of the deflection device and the resonator mirror may, in comparison with a diffraction screen which is rotatably and translatorily movable by means of a deflection device, have a lower mass and, consequently, have a higher resonance frequency. In addition, the rotational support can be established in a clearly more simple manner and permits, particularly by an MEMS scale, an improved position stability. This contributes largely to a reduction of the susceptibility to issues of the tuning of the laser diode arrangement with respect to external influences. In addition, the wavelength selective optical reflection element can be constructed largely independently of mechanical limitations which have to be taken into consideration in connection with rotationally and translatorily movable screens.

The laser diode may preferably be equipped with a collimation optical system. For example, an optical transmission component in the form of a collimation lens may be arranged at the front and/or the rear facet. This ensures that laser light exiting the front and/or the rear facet of the laser diode is parallelized. Depending on the use of the laser light however also another optical system may be used.

The emission wavelength obtained by the laser diode arrangement is determined by two conditions. A first condition is designated below as grid determined wavelength $\lambda_g$. This can be determined by the equation:

$$n \times \lambda_g = g \times \sin(\varphi) \quad \text{(formula 1)}$$

wherein:
$\lambda_g$—the wavelength determined by the diffraction surface,
g—the screen constant
the incident angle on the diffracting surface, and
n—the diffraction order, here the first order n=1

The wave length determined by the diffracting surface is consequently dependent directly on the incidence angle of the laser beam which is reflected by the resonator mirror and directed onto the diffracting surface.

The second condition is established by the resonator-determined wavelength $$\lambda_R = 2 \times L_R / m \quad \text{(formula 2)}$$

Wherein:
$\lambda_R$—wavelength determined by an optical resonator length $L_R$
$L_R$—optical length of the laser resonator
m—number of wave nodes in the laser resonator The optical length $L_R$ is composed of the partial distances of an optical length of the laser diode, a length of the laser beam between the laser diode and the resonator mirror and a length of the laser beam between the resonator mirror and the diffracting surface. Since the laser beam runs twice through this optical length the factor 2 is included in the second formula above.

Upon rotation of the resonator mirror about the pivot axis, the incident angle and the angle of reflection of the emitted laser beam at the resonator mirror change in accordance with the law of reflection. As the incidence angle $\varphi$ on the diffracting surface changes the length of the laser beam between the resonator mirror and the diffracting surface changes. By changing a single control value in the form of the first incident angle, that is, in the form of a pivot position of the resonator mirror, at the same time, the optical length of the resonator and the wavelength of the laser beam returned back into the laser diode are changed.

When, upon tuning of the laser wavelength, the number of wave nodes m is changed one speaks of a mode jump. The object of the laser diode arrangement is to provide for a tuning of the wavelength without changing the number of wavelength nodes. This is called a mode jump free tuning of the wavelength. The formal requirement herefor is $$[2 \times L_R / \lambda_g - m] \frac{1}{2} \quad \text{(formula 3)}$$

Finally, by an adaptation of the resonator length and the wavelength determined by the diffracting surface this condition is fulfilled. In accordance with the invention, this can be achieved by a pivoting of the resonator mirror. With a suitable selection of a grid constant of the diffracting surface and of the resonator-length $L_R$, the requirement for a mode jump free tuning is fulfilled in accordance with the above equation over the full tuning range of the laser.

Preferably, with an increasing first incident angle, the optical travel distance between the resonator mirror and the diffracting surface is increased. Consequently, the resonator mirror and the diffracting surface have to be so arranged that, with an increasing first incident angle, the incident point of the reflected laser beams on the diffracting surface is increasingly further spaced from the resonator mirror. The increase of the optical travel distance is therefore very simple and is caused exclusively by a pivoting of the resonator mirror.

Furthermore, preferably the wavelength of the laser beam reflected by the wavelength selective reflection element increases with an increasing first incident angle. The wavelength selective reflection element may be arranged relative to the resonator mirror in such a way that the second incident angle also increases with an increasing first incident angle. The diffracting surface then has to be so adapted that the wavelength increases with an increasing second reflection angle.

Preferably, the wavelength selective reflection element and the resonator mirror are so positioned relative to each other that the change of the optical travel distance between the resonator mirror and the diffracting surface as well as the change of the wavelength of the laser beam reflected from the wavelength selective reflection element caused by the pivoting of the resonator mirror are adapted to each other in order to fulfill the conditions in the above formula 3.

The laser diode is provided preferably with a rear bevel and a front bevel. In order to make the external resonator operative, the front bevel facing the external resonator is coated, preferably with an anti-reflection layer, so that the eigen modes of the laser diode whose space is delimited by the bevels and also forms a resonator, are suppressed. Consequently, in an advantageous embodiment, the laser diode has a rear bevel and a front bevel facing the external resonator each provided with an anti-reflection layer.

In an advantageous embodiment, the at least one wavelength selective optical reflection element is an optical diffraction screen. Generally, the diffraction screen may be a reflection screen provided with furrows capable of reflecting beams in a diffracted manner. Preferably, the diffraction screen is so designed that the incident beam hits the furrows vertically. Incident and reflected light rays are then always oriented parallel to one another. The optical diffraction screen may be obtained by scratching or holographically. Specifically, a scratched diffraction screen may be in the form of a Blaze screen.

The pivot axis is preferably positioned at a side of the resonator mirror facing away from the laser diode and spaced from the mirror surface. As a result, the mirror surface is pivoted along a circular path with the mirror surface being oriented radially outward from the circular path. The distance between the mirror surface and the pivot axis should preferably be as small as possible so that the movement range of the incident laser beam and, consequently, of the mirror surface can be minimized. Such an arrangement provides for a simple and flat design of the resonator in the form of a micromechanical element.

Preferably, a distance between a line on the mirror surface which is next to the pivot axis of the resonator mirror and an incident point of the laser beam on the mirror surface is always larger than 0. In diode lasers with an external resonator, dispersion may occur over the tuning range of the laser diode. Consequently, the index of refraction of the material of the laser diode and, as a result, the optical length of the laser diode changes. The influence of the dispersion can be compensated for by the length of the distance between a line on the mirror surface nearest to the pivot axis of the resonator mirror and the incident point of the laser beam on the mirror surface. With this distance, an independent contribution of higher order is introduced with which the dispersion of the laser material is compensated for by adaptation of the change of the resonator length depending on the resonator mirror.

An advantageous embodiment has furthermore at least one transmission component between the resonator mirror and the laser diode. In this way, in particular the uncoupling quality of the external resonator to the laser diode can be influenced.

The at least one optical transmission component may comprise a collimator which can generate from divergent laser light a parallel beam which hits the resonator mirror.

Further, for obtaining a desired beam of parallel light rays, a collimator may also be arranged on a side of the rear bevel facing away from the laser diode.

Preferably, the at least one wavelength selective reflection element is arranged inclined with respect to the direction of the laser beam emitted from the laser diode. In particular, the diffracting surface may be non-parallel to the emission direction.

The resonator mirror may also be arranged at an angle to the emission direction of the laser beam emitted from the laser diode wherein the mirror surface faces the laser diode.

The resonator mirror may in this case be movable in such a way that, at least in one position of the resonator mirror and the wavelength selective reflection element, the resonator mirror is oriented parallel to the wavelength selective reflection element. Consequently, the resonator mirror can cover a large area of the wavelength selective reflection element by the reflection of laser beams by pivoting.

The laser diode arrangement is preferably manufactured in the form of a micro-mechanical system. The respective deflection devices may be in the form of electrostatic actuators.

Figure 2:
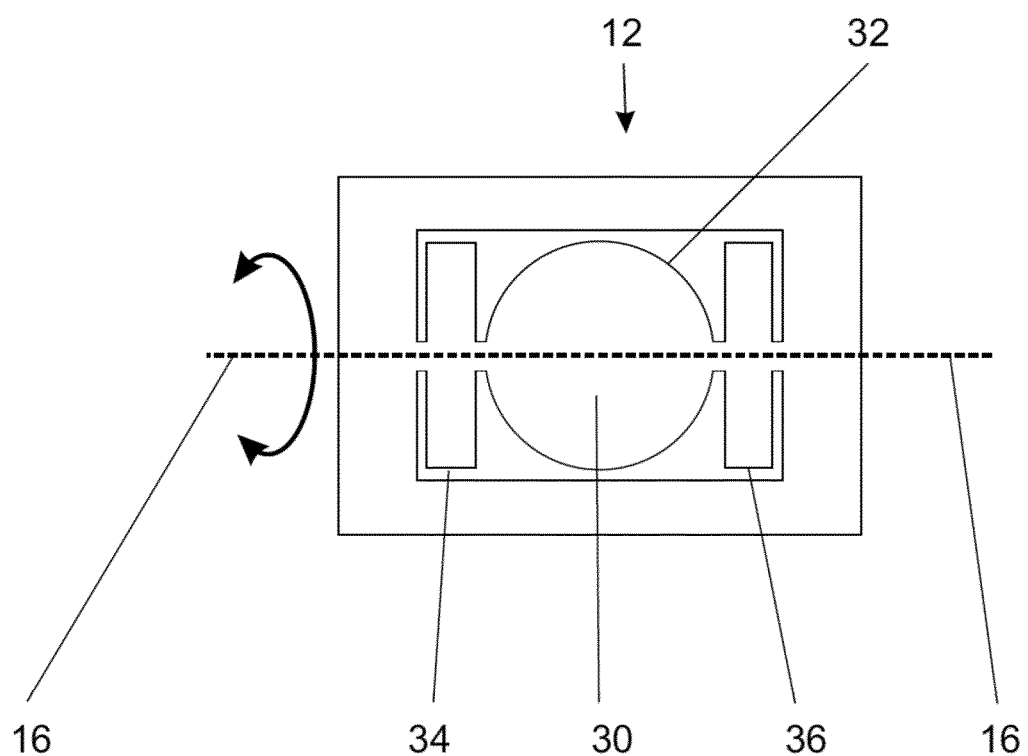
Figure 3A:
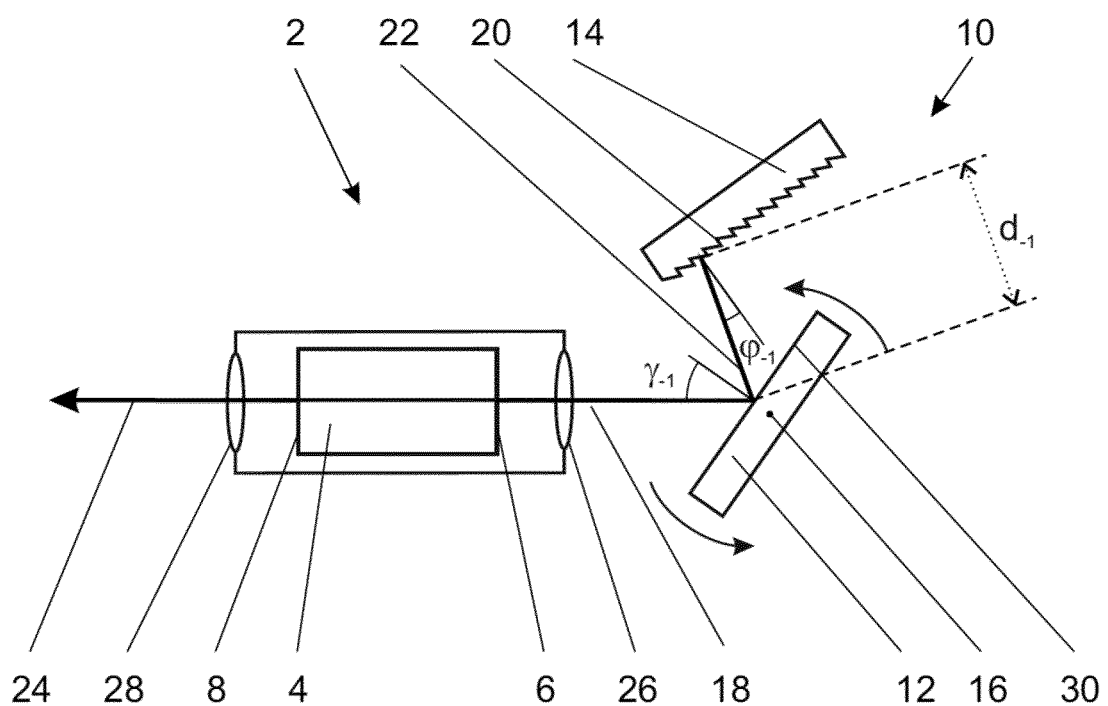
Figure 3B:
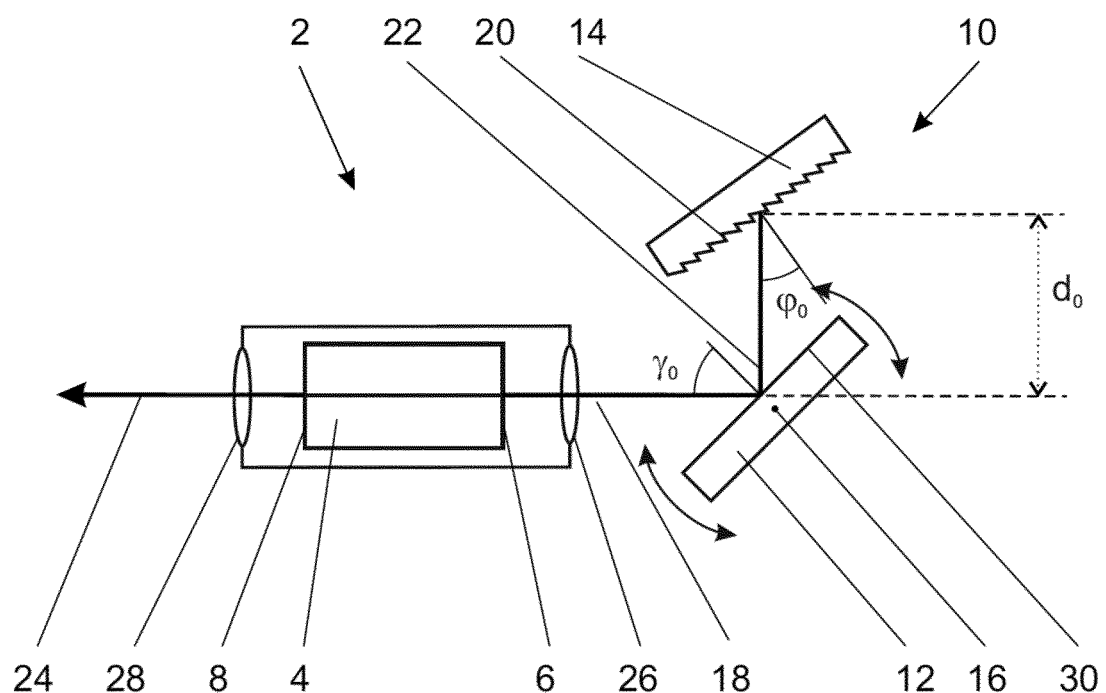
Figure 3C:
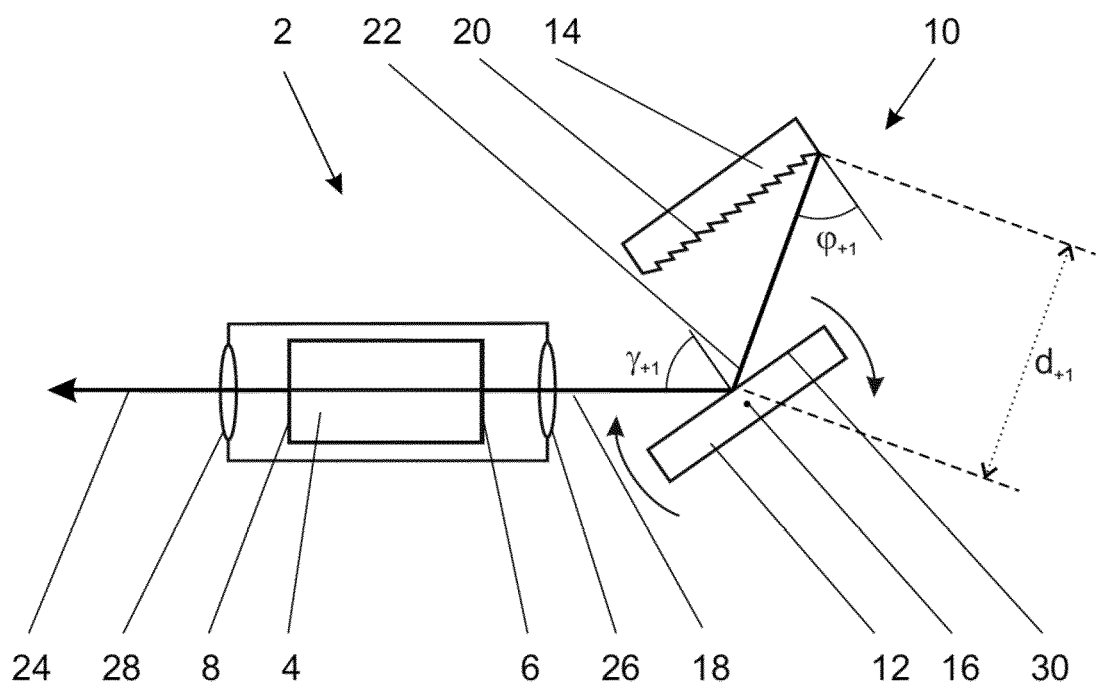

Further features, details and advantages of the invention will become apparent from the text of the claims as well as the following description of exemplary embodiments with reference to the accompanying drawings. It is shown in:

FIG. 1 a schematic representation of a laser diode arrangement,

FIG. 2 a schematic representation of a micro-mechanical resonator mirror,

FIGS. 3a to 3c schematic representations of the laser diode arrangement with different angular positions of the resonator mirror with the pivot axis of the resonator mirror in the middle of the mirror.

Figure 4A:
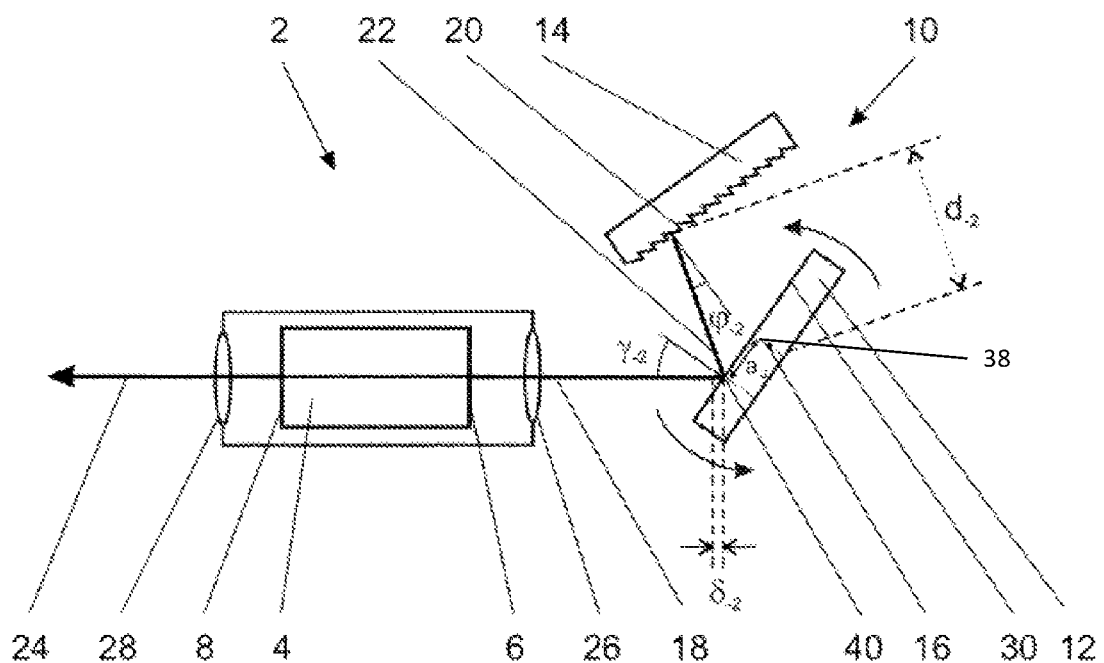
Figure 4B:
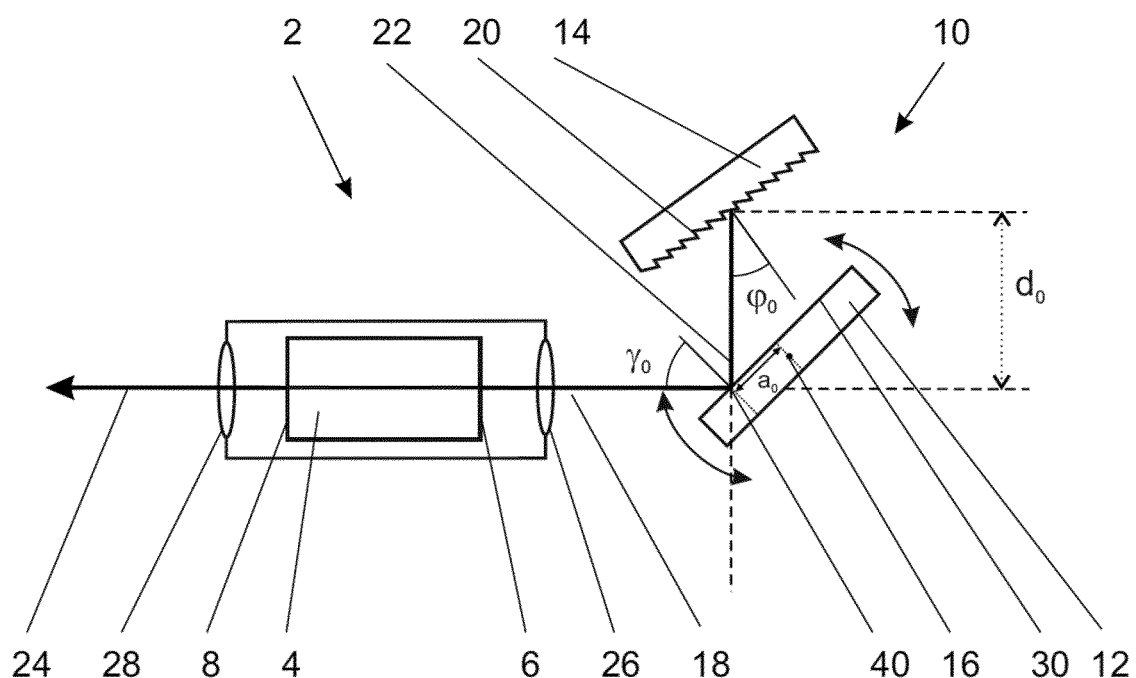
Figure 4C:
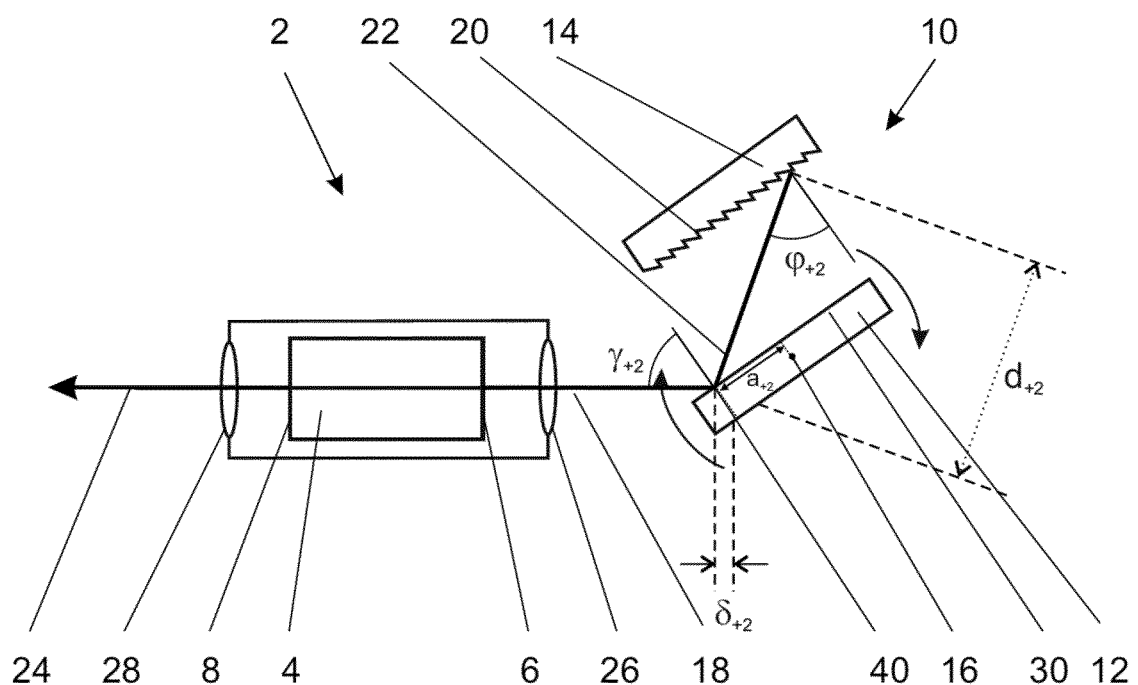
Figure 5:
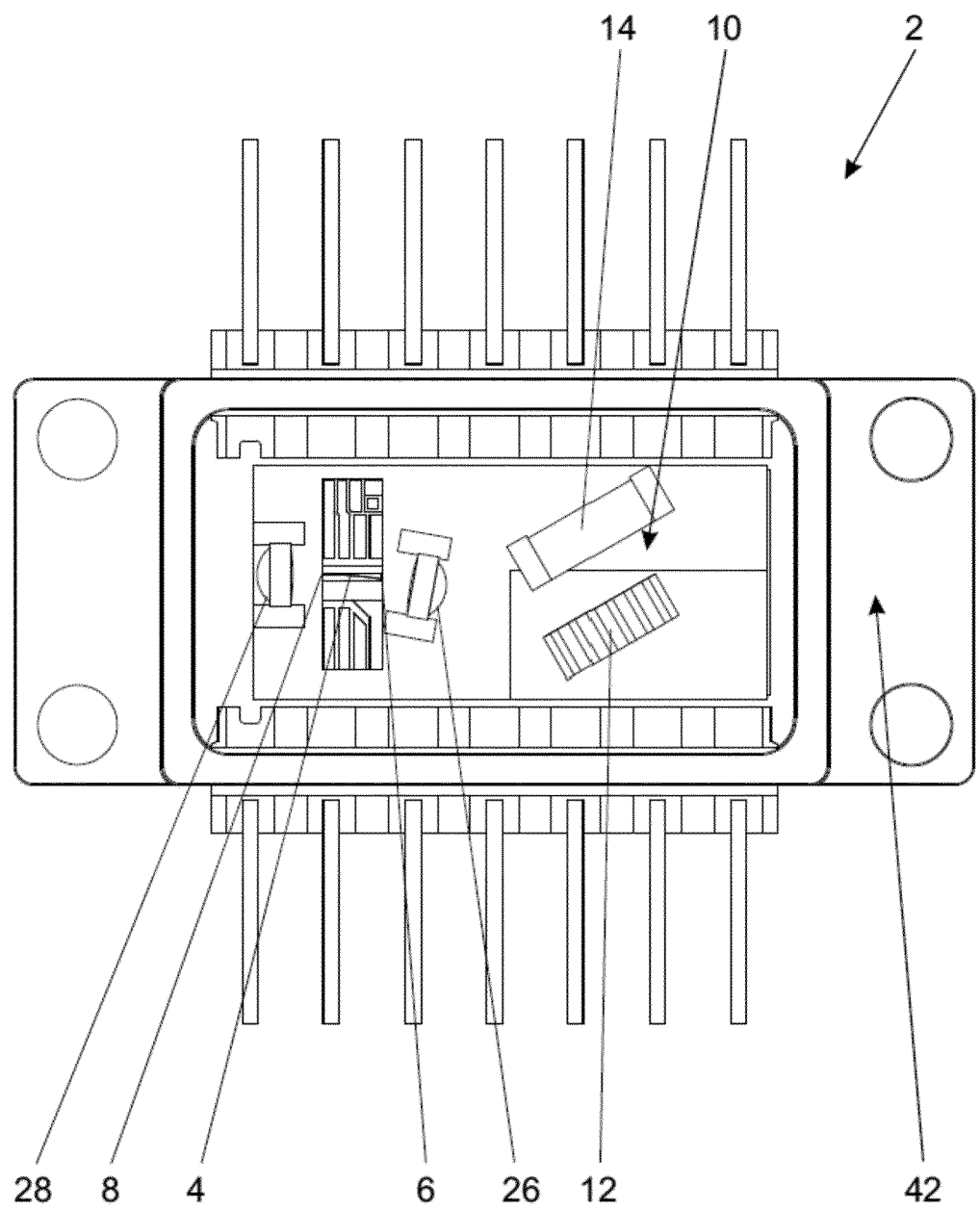

FIGS. 4a to 4c schematic representations of the laser diode arrangement with different angular positions of the resonator mirror with the pivot axis of the resonator mirror displaced for compensation of dispersion effects, and FIG. 5 an exemplary micro-mechanical construction of the laser diode arrangement.

FIG. 1 shows schematically a laser diode arrangement 2 with a diode laser 4 which has a front bevel 6 which is preferably provided with an antireflection layer and a rear bevel 8 forming an end mirror. The front bevel 6 faces an external resonator 10 which includes a resonator mirror 12 and a wavelength selective optical reflection element in the form of a diffraction screen 14. The resonator mirror 12 is supported so as to be pivotable about a pivot axis 16. A laser beam 18 emitted from the laser diode 4 hits the resonator mirror 12 and is reflected therefrom to the diffraction screen 14. A diffracting surface 20 diffracts and reflects the incident light so that a light of first diffraction order 22 hits the resonator mirror and is reflected back into the laser diode 4.

The laser beam 24 is uncoupled via the rear bevel 8. For a parallel alignment of the laser beams 18 and 24 a collimation optical system including a first collimator in the form of a first collimation lens 26 and a second collimator in the form of a second collimation lens 28 are used.

The optical length established with the arrangement 2 which will be designated below by $L_R$ is composed by the sum of the optical length of the laser diode 4 and the optical length of the travel distances of the laser beams 18 and 22. The diffracting surface 20 can be in the form of a Blaze screen or another form of screen and is arranged at an angle with respect to the omitted laser beam 18. The diffraction screen 14 is preferably provided with screen lines which extend parallel to the pivot axis 16. By a rotation of the resonator mirror 12, the direction of the laser beam 22 extending between the resonator mirror 12 and the diffraction screen 14 can be influenced Hereby the optical length $L_R$ of the resonator which is determined by the diffracting surface 20 dependent on the incident direction can be influenced. This will be explained in the description of FIGS. 3a to 4c in a more detailed manner.

FIG. 2 shows a micro-mechanical construction of the resonator mirror 12. A mirror surface 30 is formed on a circular surface 32 which is coupled to two actuator sections 34 and 36. They may be based on an electrostatic operating principle and perform a quasi-static position in the form of a rotation about the pivot axis 16 which as dependent on the input voltage. The resonator mirror 12 may be manufactured as a single piece based on silicon.

FIGS. 3a to 3c show the influence of a rotation of the resonator mirror 12 on the tuning of the laser diode arrangement 2.

As shown in FIG. 3a, the laser beam 18 emitted from the laser diode 4 hits the mirror surface 30 with an incident angle $\gamma_{-1}$ and, because of the reflection of the laser beam 18, becomes a reflected laser beam 22, which hits the diffraction screen 14 at an incident angle $\varphi_{-1}$. The wavelength generated by the diffraction screen with a first diffraction order is calculated consequently as $\lambda_g = g \times \sin(\varphi_{-1})$.

The orientation of the diffraction screen 14 relative to the resonator mirror 12 results in an optical travel distance $d_{-1}$ for the laser beam 22. In the example of FIG. 3a, an area of the diffraction screen 14 close to the laser diode 4 is involved which results in a small optical travel distance $d_{-1}$. The optical length $L_R$ of the laser resonator 10 is calculated as the sum of the optical length of laser diode 4, the length of the laser beam 18 between the laser diode 4 and the resonator mirror 12 and the optical travel distance $d_{-1}$ caused by the rotation of the rotational position of the resonator mirror 12. In FIG. 3b, the resonator mirror 12 is shown turned somewhat further in a clockwise direction so that for example an incident angle $\gamma_0$ of about 45° is established. In this case, the diffraction screen 14 is hit by the laser beam for example in the center thereof so that an incident angle $\varphi_o$ is obtained. This exemplary constellation results in an optical travel distance $d_o$ for the laser beam 22 which is larger than $d_{-1}$. Based on the changed incident angle $\gamma_0$ and the larger optical travel distance, a stationary wave of a higher wavelength can be established between the rear bevel 8 and the diffraction screen 14 so that the uncoupled laser beam 24 has a lower frequency than the one according to FIG. 3a.

In an analogous way, this applies to the representation of FIG. 3c. There, the resonator mirror 12 is shown in the drawing plane turned even further in a clockwise direction so that the incident angle $\gamma_{+1}$ is even more enlarged. The diffraction dependent wavelength is influenced by the also increased incident angle $\varphi_{+1}$ established at the diffraction screen 14 and the optical travel distance $d_{+1}$, which is larger than $d_0$ and $d_{-1}$, results in a still larger wavelength of the stationary wave between the rear bevel 8 and the diffraction screen 14 while the wave modes remain the same as in FIGS. 3a and 3b. Consequently, the uncoupled laser beam 24 can have a still lower frequency.

Over the tuning range, the laser diode 4 may exhibit dispersion effects by which the index of refraction of the material of the laser diode 4 and, as a result, the optical length of the laser diode change. As shown in FIGS. 4a to 4c, these effects can be compensated for by an appropriate positioning of the pivot axis 16 of the resonator mirror 12.

The pivot axis 16 can be arranged at the middle of the resonator mirror 12 at a side of the resonator mirror 12 facing away from the resonator mirror 12. For example, the pivot axis 16 is displaced with respect to the arrangement of FIGS. 1 and 3a to 3c so that the distance between a line 38 on the mirror surface 30 which is closest to the pivot axis 16 of the resonator mirror and an incident point 40 of the laser beam 18 on the mirror surface 30 is increased. The pivot axis 16 is shown in the drawing plane clearly above the line indicating the laser beam 18. The laser beam 18 then hits mainly a radially outer section of the resonator mirror 12 directed toward the laser diode 4.

With this displacement of the pivot axis 16, the optical length of the laser beam 18 between the front bevel 6 and the resonator mirror 12 is changed by an amount $d_{-2}$ or, respectively, $d_{+2}$, while the pivot position is the same as in FIGS. 3a to 3c. At the same time, the incident angles of the laser beam 18 on the resonator mirror 12 may change from $\gamma_{-1}$ to $\gamma_{-2}$ and from $\gamma_{+1}$ to $\gamma_{+2}$. With an appropriate adaptation of the position of the pivot axis 16 consequently, the dispersion effect of the laser diode 4 can be compensated for by a combined control of diffraction parameters and the optical length $L_R$ between the rear bevel 8 and the diffraction screen 14.

Finally, FIG. 5 shows, by example, an actual laser diode arrangement 2 in the form of a micromechanical system which is arranged on a carrier 42.

The invention is not limited to the embodiment described above but is variable in many ways.

All features and advantages as apparent from the claims, the description and the drawings including construction details, spatial arrangements and method steps may be essential in connection with the invention alone or in various combinations.

LISTING OF REFERENCE NUMERALS

2 Laser diode arrangement
4 Laser diode
6 Front bevel
8 Rear bevel
10 External resonator
12 Resonator mirror
14 Wavelength selective optical reflection element/different screen
16 Pivot axis
18 Laser beam between front bevel and resonator mirror
20 Diffraction surface
22 First diffraction order/laser beam
24 Uncoupled laser beam
26 First collimation lens
28 Second collimation lens
30 Mirror surface
32 Circular surface
34 Actuator section
36 Actuator section
38 Line of mirror surface 30 closest to the first pivot axis
40 Incident point of laser beam on mirror surface
42 Carrier
$\gamma$, $\gamma_{-2}$, $\gamma_{-1}$, $\gamma_0$, $\gamma_{+1}$, $\gamma_{+2}$, First incident angle/incident angle of the emitted laser beam on the mirror surface
$\varphi$, $\varphi_{-2}$, $\varphi_{-1}$, $\varphi_0$, $\varphi_{+1}$, $\varphi_{+2}$, Second incident angle/incident angle of the laser beam reflected from the mirror surface onto the diffracting surface
$a_{-2}$, $a_0$, $a_{+2}$ Distance between the line next to the first pivot axis and the incident point of the laser beam on the mirror surface
$d_{-2}$, $d_{-1}$, $d_0$, $d_{+1}$, $d_{+2}$ Optical travel distance between the mirror surface and the diffracting surface
$\delta_{-2}$, $\delta_{+2}$ Change of the optical length of the laser beam between the front bevel and the resonator mirror upon change of the incident angle on the mirror surface

What is claimed is:

1. Laser diode arrangement for generating dispersion compensated single-mode tunable laser radiation, comprising:
   a laser diode and coupled thereto an external resonator including a resonator mirror and at least one wavelength selective optical reflection element with a diffracting surface, wherein the resonator mirror is supported so as to be rotatable about a pivot axis disposed across an extent of the mirror so that opposite ends of the resonant mirror rotate there about and is selectively rotatable about the pivot axis by a microelectromechanical MEMS pivoting arrangement characterized in that
   a) the external resonator is constructed and arranged so that a laser beam emitted from the laser diode into the external resonator hits a mirror surface of the resonator mirror at an incident point with a first incidence angle (g) which depends on the pivot position of the resonator mirror and is reflected from the mirror surface to the at least one wavelength selective optical reflection element under a second incident angle ( ) which depends on the first incident angle (g), wherein a distance between a line on the mirror surface closest to the pivot axis of the resonator mirror and the incident point is larger than zero,
   b) wherein an optical travel distance (d) between the resonator mirror and the diffracting surface is influenced by the first incident angle (g), and
   c) the wavelength selective optical reflection element reflects the laser beam diffracted back to the resonator mirror so that it is directed by the resonator mirror back to the laser diode,
   d) wherein the wavelength of the laser beam reflected by the wavelength selective reflection element is influenced by the second incidence angle (j) and a degree of compensation of dispersion of the laser beam is influenced by an amount of the distance between the incident point and the line on the mirror surface closest to the pivot axis.

2. Laser diode arrangement according to claim 1, wherein the optical travel distance (d) between the resonator mirror and the diffracting surface becomes larger with an increasing first incidence angle (g).

3. The laser diode arrangement according to claim 1, wherein the wavelength of the laser beam reflected by the wavelength selective reflection element increases with an increase of the first incidence angle (g).

4. The laser diode arrangement according to claim 1, wherein the at least one wavelength selective optical reflection element is an optical diffraction screen.

5. The laser diode arrangement according to claim 1, wherein the pivot axis is positioned proximal to a side of the resonator mirror facing toward the laser diode.

6. The laser diode arrangement according to claim 1, further including at least one optical transmission component arranged between the resonator mirror and the laser diode.

7. The laser diode according to claim 6, wherein the at least one transmission component comprises a collimator.

8. The laser diode arrangement according to claim 1, wherein the at least one wavelength selective reflection element is arranged inclined with respect to the direction of the laser beam emitted from the laser diode whereby the diffracting surface faces away from the laser diode.

9. The laser diode arrangement according to claim 1, wherein the resonator mirror is inclined with respect to the direction of the laser beam emitted from the laser diode and the mirror surface faces the laser diode.

10. The laser diode arrangement according to claim 1, wherein the resonator mirror is movable in such a way that, at least in one position of the resonator mirror and the wavelength selective reflection element, the resonator mirror is oriented parallel to the wavelength selective reflection element.

11. The laser diode arrangement according to claim 1, wherein the laser diode arrangement is manufactured in the form of a micromechanical system.

12. Laser diode arrangement for dispersion compensation in a single-mode tunable laser, comprising:
a laser diode and coupled thereto an external resonator including a resonator mirror and at least one wavelength selective optical reflection element with a diffracting surface, wherein the resonator mirror is supported so as to be rotatable about a pivot axis disposed across an extent of the mirror so that opposite ends of the resonant mirror rotate there about and is selectively rotatable about the pivot axis by a microelectromechanical MEMS pivoting arrangement characterized in that:
the external resonator is constructed and arranged so that a laser beam emitted from the laser diode into the external resonator hits a mirror surface of the resonator mirror at an incident point and is reflected from the mirror surface to the at least one wavelength selective optical reflection element, wherein a distance between a line on the mirror surface closest to the pivot axis of the resonator mirror and the incident point is larger than zero, and
the wavelength selective optical reflection element reflects the laser beam, at a wavelength determined by the wavelength selective optical reflection element, back to the resonator mirror so that the laser beam from the wavelength selectable optical reflection element is directed by the resonator mirror back to the laser diode, wherein a degree of compensation of dispersion is influenced by an amount of the distance between the incident point and the line on the mirror surface closest the pivot axis.

13. The laser diode arrangement according to claim 12, wherein the at least one wavelength selective optical reflection element is an optical diffraction screen.

14. The laser diode arrangement according to claim 12, wherein the pivot axis is positioned proximal to a side of the resonator mirror facing the laser diode.

* * * * *